United States Patent
Mo et al.

(10) Patent No.: US 8,659,313 B2
(45) Date of Patent: Feb. 25, 2014

(54) TEST BRACKET FOR CIRCUIT BOARD

(75) Inventors: Jin-Ming Mo, Shenzhen (CN); Sha Peng, Shenzhen (CN); Yu-Mei Li, Shenzhen (CN); Hui Li, Shenzhen (CN)

(73) Assignees: Hong Fu Jin Precision Industry (ShenZhen) Co., Ltd, Shenzhen (CH); Hon Hai Precision Industry Co., Ltd., New Taipei (TW)

( * ) Notice: Subject to any disclaimer, the term of this patent is extended or adjusted under 35 U.S.C. 154(b) by 356 days.

(21) Appl. No.: 13/048,885

(22) Filed: Mar. 16, 2011

(65) Prior Publication Data

US 2012/0223731 A1 Sep. 6, 2012

(30) Foreign Application Priority Data

Mar. 2, 2011 (CN) .......................... 2011 1 0049863

(51) Int. Cl.
*G01R 31/00* (2006.01)
(52) U.S. Cl.
USPC .................................................. 324/756.01
(58) Field of Classification Search
USPC .................................................. 324/756.01
See application file for complete search history.

(56) References Cited

U.S. PATENT DOCUMENTS

| 4,067,266 | A | * | 1/1978 | Lafargue | 108/172 |
| 4,538,104 | A | * | 8/1985 | Douglas et al. | 324/750.2 |
| 5,055,779 | A | * | 10/1991 | Kerschner et al. | 324/757.02 |
| 5,642,263 | A | * | 6/1997 | Lauruhn | 361/801 |
| 6,166,916 | A | * | 12/2000 | Jelinger | 361/756 |
| 6,305,966 | B1 | * | 10/2001 | Arbogast et al. | 439/377 |
| 6,508,184 | B1 | * | 1/2003 | Winter et al. | 108/125 |
| 6,522,546 | B1 | * | 2/2003 | Boyer et al. | 361/720 |
| 6,667,630 | B2 | * | 12/2003 | Abdulky | 324/754.03 |
| 2004/0090747 | A1 | * | 5/2004 | Wang et al. | 361/719 |

FOREIGN PATENT DOCUMENTS

TW 188132 7/1992

* cited by examiner

*Primary Examiner* — Patrick J Assouad
*Assistant Examiner* — Demetrius Pretlow
(74) *Attorney, Agent, or Firm* — Altis Law Group, Inc.

(57) ABSTRACT

A test bracket for testing a circuit board includes a base, two connection pieces, and a supporting member for supporting the circuit board. The base includes a board and two posts extending up from the board. The supporting member includes two poles and a number of ribs slidably connected between the poles. First ends of the connection pieces are respectively detachably connected to the posts of the base, and second ends of the connection pieces opposite to the first ends are respectively pivotably connected to the poles.

13 Claims, 4 Drawing Sheets

TEST BRACKET FOR CIRCUIT BOARD

CROSS-REFERENCE OF RELATED ART

Relevant subject matter is disclosed in a pending U.S. patent application, titled "TEST BRACKET FOR CIRCUIT BOARD," with the application Ser. No. 12/967,069, which is assigned to the same assignee as this patent application.

BACKGROUND

1. Technical Field

The present disclosure relates to a test bracket for testing circuit boards.

2. Description of Related Art

Circuit boards of electronic devices need to be tested before shipment. Circuit boards are put on an insulation board for testing one side of the circuit board. After that, the circuit board is turned over and put on the insulation board, so that the other side can be tested. However, when the circuit board is turned this way, elements of the circuit board may be damaged, and furthermore, this method is time consuming.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
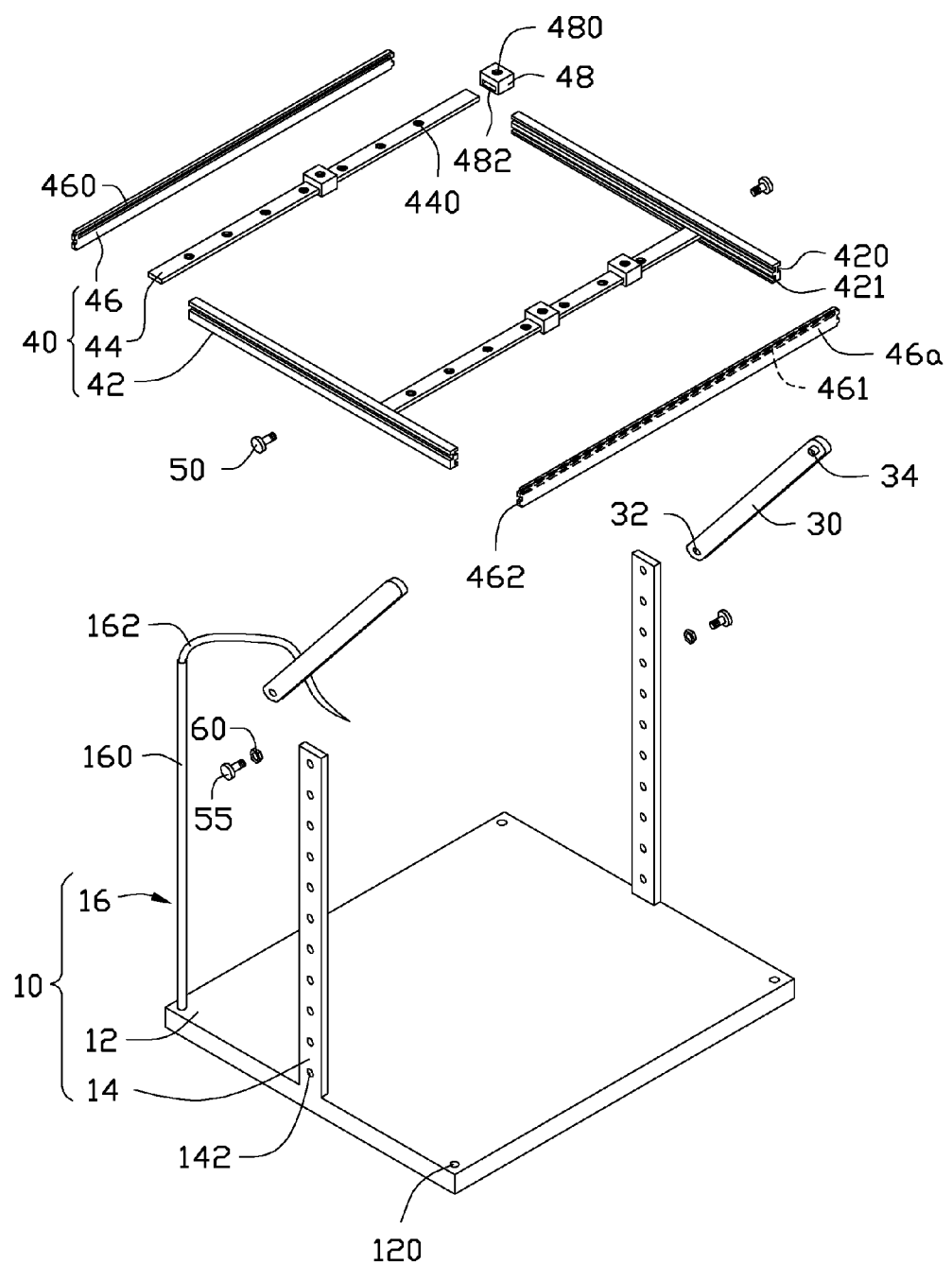
FIG. 1 is an exploded, isometric view of an exemplary embodiment of a test bracket for a circuit board.

Referring to FIG. 1, an exemplary embodiment of a test bracket for a circuit board 70 (shown in FIGS. 3 and 4) includes a base 10, two connection pieces 30, and a supporting member 40.

The base 10 includes a substantially rectangular-shaped board 12, two long posts 14 substantially perpendicularly extending up from opposite sides of the board 12, and a holding portion 16 mounted to one of four corners of the board 12. The board 12 defines four fixing holes 120 in the four corners. Each post 14 defines a row of spaced through holes 142. Each row of through holes 14 are arranged from top to bottom of the corresponding post 14. The holding portion 16 is used to hold a probe (not shown), and includes a rod 160 and an arm 162. A first end of the rod 160 is inserted into one of the fixing holes 120 of the board 12; a second end of the rod 160 opposite to the first end defines a fixing hole (not shown) in an end surface of the second end. The arm 162 is made of pliable metal material, but still stiff enough that it can maintain a shape once bent to that shape until acted on by a force greater than the stiffness, such as what an operator could easily apply with their hands when positioning the arm 162. An end of the arm 162 is inserted into the fixing hole of the rod 160.

The connection pieces 30 are substantially bar-shaped. A through hole 32 is defined in a first end of each connection piece 30, and a pin 34 extends from a side of a second end of each connection piece 30 opposite to the first end.

The supporting member 40 is made of insulating material, such as wood or plastic. The supporting member 40 includes two parallel poles 42, two ribs 44 substantially perpendicularly connected between the poles 42, a fixing bar 46, a movable bar 46a, and a plurality of substantially cube-shaped blocks 48. Each pole 42 longitudinally defines a first slot 420 in an outer surface opposite to the other pole 42, and two second slots 421 parallel to the first slot 420 in an inner surface of the pole 42 facing the other pole 42. A third slot 460 is longitudinally defined in a side of the fixing bar 46, facing the movable bar 46a. A fourth slot 461 is longitudinally defined in a side of the movable bar 46a, facing the fixing bar 46. Two spaced protrusions 462 extend from each of opposite ends of each of the fixing bar 46 and the movable bar 46a, corresponding to the second slots 421 of the corresponding pole 42. The fixing bar 46 can be integrally formed between first ends of the poles 42, and the movable member 46a is detachably installed between second ends of the poles 42 opposite to the first ends. A plurality of spaced threaded holes 440 is defined in each rib 44. Each block 48 defines a threaded hole 480 extending through top and bottom surfaces of the block 48, and a through hole 482 extending through opposite sides of the block 48.

Figure 2:
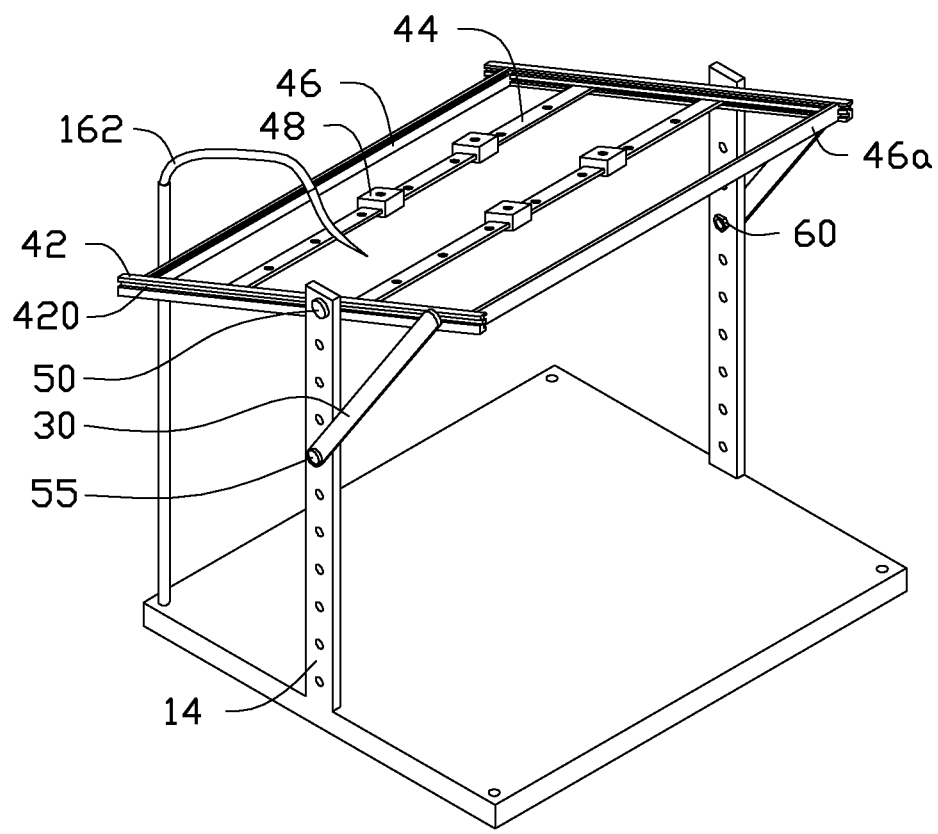
FIG. 2 is an assembled, isometric view of the test bracket of FIG. 1.

Referring to FIG. 2, in assembly, each rib 44 extends through the through holes 482 of the blocks 48; therefore, the blocks 48 are sleeved about the rib 44. The ribs 44 are slid along the lower second slots 421 of the poles 42 from the second ends of the poles 42. The protrusions 462 of the movable bar 46a are inserted into the corresponding second slots 421 of the poles 42 from the second ends of the poles 42. The poles 42 are located between the posts 14, with the second slots 421 of the posts 14 aligned with the through holes 142 in the distal end of the corresponding posts 14. Two screws 50 pivotably extend through the through holes 142 of the posts 14 and engage in the first slots 420 of the corresponding poles 40. Therefore, the supporting member 40 is pivotably installed to the base 10.

The pins 34 of the connection pieces 30 are pivotably and slidably engaged in the first slots 420 of the corresponding poles 40. Two screws 55 extend through the through holes 32 of the corresponding connection pieces 30 and the corresponding through holes 142 of the corresponding posts 14, and then engage in two nuts 60. Therefore, the connection pieces 30 are pivotably mounted to the corresponding posts 14, and pivotably and slidably mounted to the poles 42.

Figure 3:
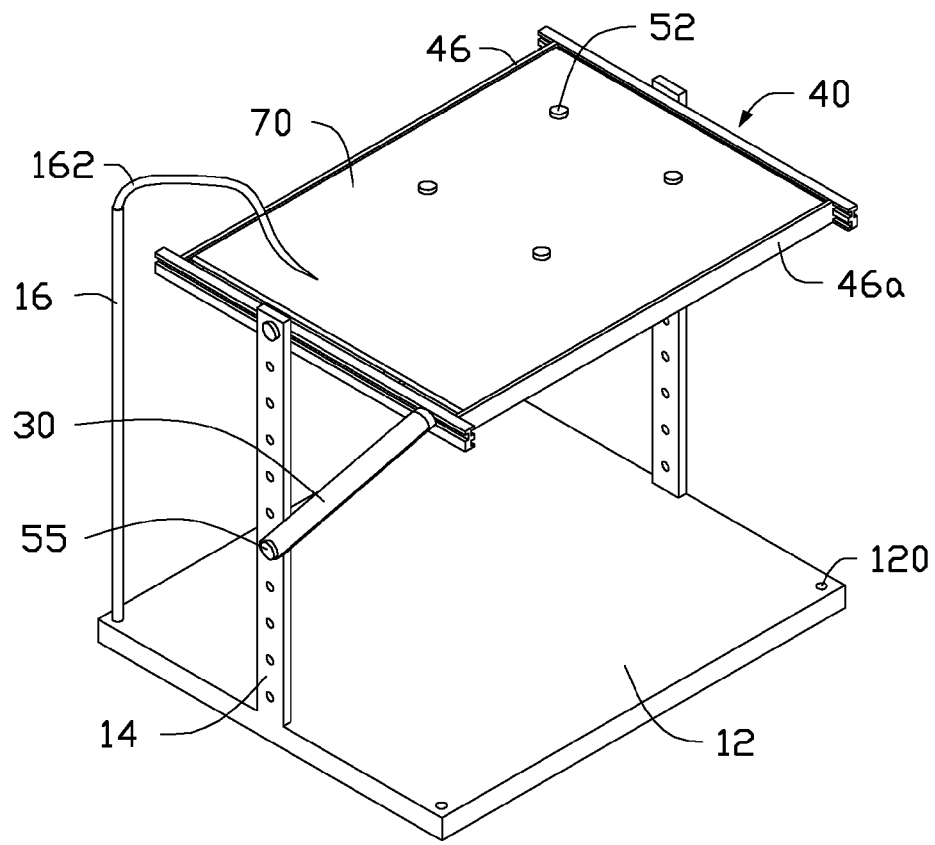
FIG. 3 is an assembled, isometric view of the test bracket of FIG. 2 and a circuit board.
Figure 4:
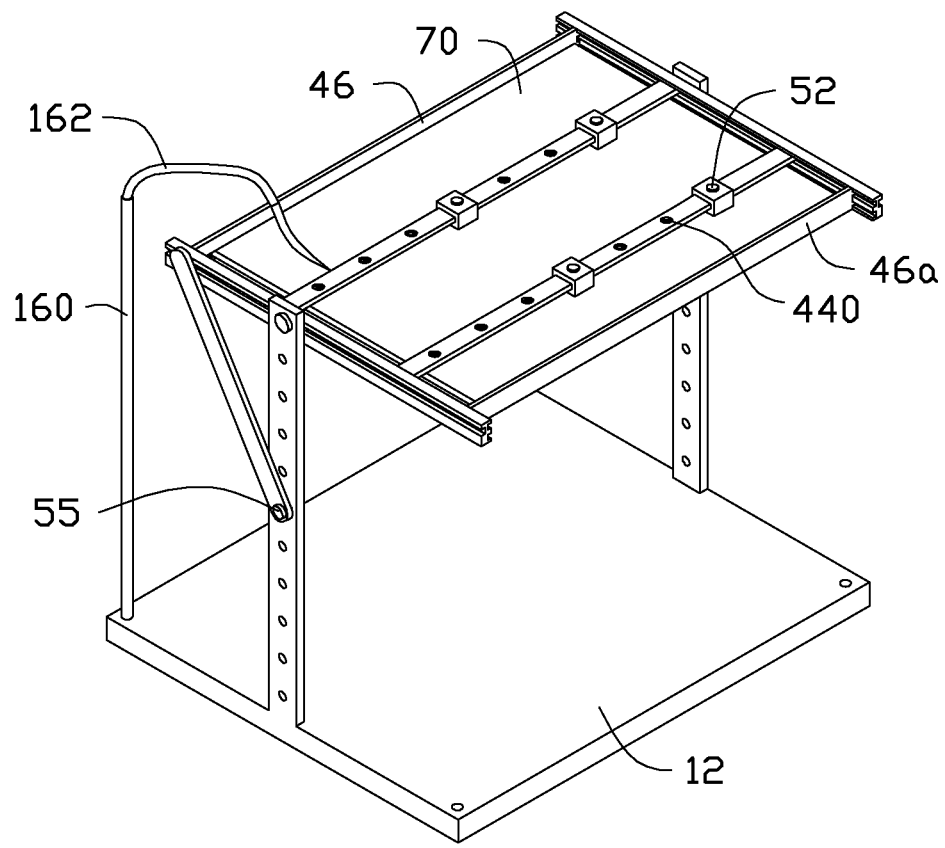
FIG. 4 is similar to FIG. 2, but showing another state of use.

Referring to FIG. 3 and FIG. 4, in use, the ribs 44 are slid along the corresponding second slots 421, and the blocks 48 are slid along the corresponding ribs 44, for fixing different sized circuit boards, and the threaded holes 480 of the blocks 48 are aligned with the corresponding threaded holes 440 of the ribs 44. A plurality of screws 52 extend through the circuit board 70, the threaded holes 480 of the blocks 48, and then engage in the corresponding threaded holes 440 of the ribs 44, to fix the circuit board 70 to the test bracket. The movable bar 46a is slid along the second slots 421 of the poles 42 toward the fixing bar 46, to sandwich the circuit board 70 tightly between the fixing bar 46 and the movable bar 46a. Therefore, a side of the circuit board 70 can be tested. The nuts 60 and screws 55 are loosened; the first ends of the connection pieces 30 are removed from the posts 14, thereby the supporting member 40 with the circuit board 70 can be turned over using the screws 50 as a pivot point. The screws 55 and nuts 60 are then screwed to fix the connection pieces 30. Therefore, the circuit board 70 can be turned easily and safely, and the opposite side of the circuit board 70 can be tested. In other embodiments, the supporting member 40 is turned over, and the pins 34 of the connection pieces 30 can be slid along the first slots 420 of the corresponding poles 42, to change a slanted angle of the supporting member 40.

During the test, the probe is fixed on the holding portion 16, to test the circuit board 70. The arm 162 can be bent to a desired shape to help to maintain the probe. Thereby, the probe can test a portion on the circuit board 70. Furthermore, the holding portion 16 can be inserted into another fixing hole 120 of the board 12, to test another portion of the circuit board 70. In other embodiments, each of the other fixing holes 120 of the board 12 can receive a holding portion 16 fixing another probe to test the circuit board 70.

In other embodiments, the blocks 48 can be omitted. The circuit board 70 is fixed to the ribs 44 directly. The ribs 44 can be omitted too, thereby a first end of the circuit board 70 is inserted into the fourth slot 461 of the movable bar 46a, and a second end of the circuit board 70 is inserted into the third slot 460 of the fixed bar 46.

The ribs 44, the movable bar 46a, and the pins 34 can be slid along and positioned in the corresponding slots 421, 420.

In other embodiments, the fixing bar 46 can be replaced by a movable bar and is detachably installed to the first ends of the poles 42.

In other embodiments, each pole 42 defines a second slot 421 in the inner surface of the pole 42. A protrusion 462 extends from each of opposite ends of each of the fixing bar 46 and the movable bar 46a.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A test bracket for testing a circuit board, the test bracket comprising:
   a base comprising a board and two posts perpendicularly extending up from the board and spaced apart from each other;
   two connection pieces; and
   a supporting member for supporting the circuit board, the supporting member comprising two poles and a plurality of ribs slidably connected between the two poles;
   wherein first ends of the connection pieces are respectively detachably connected to the posts, and second ends of the connection pieces are respectively pivotably connected to outer sides of the two poles; and
   wherein each pole defines a first slot in an outer surface of the pole, each post defines a plurality of through holes from top to bottom of the pole, and two screws respectively pivotably extend through two corresponding through holes of the posts and engage in the first slots of the poles.

2. The test bracket of claim 1, wherein the board is rectangular-shaped, a holding portion extends up from a corner of the board, the holding portion comprises a rod and an arm extending from a top of the rod, the arm is made of pliable metal material.

3. The test bracket of claim 1, wherein a through hole is defined in the first end of each connection piece, a screw extends through the through hole of the connection piece and a corresponding through hole of the corresponding post, and engages with a nut.

4. The test bracket of claim 3, wherein a pin extends from the second end of each connection piece, and pivotably engages in the first slot of the corresponding pole.

5. The test bracket of claim 1, wherein the supporting member is made of insulating material.

6. The test bracket of claim 1, wherein each pole defines two second slots in an inner surface of the pole, a plurality of spaced threaded holes is defined in each rib, opposite ends of the ribs are slidably engaged in the corresponding second slots of the poles.

7. The test bracket of claim 1, wherein each rib is attached with a plurality of blocks each defining a threaded hole.

8. The test bracket of claim 1, wherein the supporting member further comprises two bars, each bar defines a third slot in a side of the bar to receive a corresponding side of the circuit board, and one of the bars is movably connected between the poles.

9. A test bracket for testing a circuit board, the test bracket comprising:
   a base comprising a board and two posts perpendicularly extending up from the board;
   two connection pieces; and
   a supporting member for supporting the circuit board, the supporting member comprising two poles, and two bars connected between the poles to hold the circuit board among the poles and the bars;
   wherein first ends of the connection pieces are respectively detachably connected to the posts, and second ends of the connection pieces are respectively movably connected to the poles, at least one of the bars is slidably connected between the poles; and
   wherein each pole defines a first slot in an outer surface of the pole, each post defines a plurality of through holes from top to bottom of the pole, and two screws respectively pivotably extend through two corresponding through holes of the posts and engage in the first slots of the poles.

10. The test bracket of claim 9, wherein a through hole is defined in the first end of each connection piece, a screw extends through the through hole of the connection piece and a corresponding through hole of the corresponding post, and engages with a nut.

11. The test bracket of claim 10, wherein a pin extends from the second end of each connection piece, and pivotably engages in the first slot of the corresponding pole.

12. The test bracket of claim 9, wherein the supporting member is made of insulating material.

13. The test bracket of claim 9, wherein each bar defines a third slot in a side of the bar to receive a corresponding side of the circuit board, and one of the bars is movably connected between the poles.

* * * * *